(12) United States Patent
Broekaart

(10) Patent No.: US 11,800,803 B2
(45) Date of Patent: Oct. 24, 2023

(54) HYBRID STRUCTURE FOR A SURFACE ACOUSTIC WAVE DEVICE

(71) Applicant: Soitec, Bernin (FR)

(72) Inventor: Marcel Broekaart, Theys (FR)

(73) Assignee: SOITEC, Bernin (FR)

( * ) Notice: Subject to any disclaimer, the term of this patent is extended or adjusted under 35 U.S.C. 154(b) by 1171 days.

(21) Appl. No.: 16/306,822

(22) PCT Filed: May 30, 2017

(86) PCT No.: PCT/FR2017/051339
§ 371 (c)(1),
(2) Date: Dec. 3, 2018

(87) PCT Pub. No.: WO2017/207911
PCT Pub. Date: Dec. 7, 2017

(65) Prior Publication Data
US 2019/0165252 A1    May 30, 2019

(30) Foreign Application Priority Data

Jun. 2, 2016 (FR) ........................ 1655030

(51) Int. Cl.
H01L 41/312 (2013.01)
H01L 41/08 (2006.01)
(Continued)

(52) U.S. Cl.
CPC ............ H10N 30/072 (2023.02); H03H 3/10 (2013.01); H03H 9/02543 (2013.01);
(Continued)

(58) Field of Classification Search
CPC ............... H01L 41/312; H01L 41/0805; H01L 41/0815; H03H 3/10; H03H 9/02543;
(Continued)

(56) References Cited

U.S. PATENT DOCUMENTS

2007/0296306 A1    12/2007    Hauser et al.
2009/0224853 A1    9/2009    Oh
(Continued)

FOREIGN PATENT DOCUMENTS

CN    102361061 B    4/2015
DE    102004045181 A1    3/2006
(Continued)

OTHER PUBLICATIONS

Japanese Notice of Rejection from Japanese Application No. 2018-563171, dated Aug. 10, 2021, 4 pages.
(Continued)

*Primary Examiner* — Shawki S Ismail
*Assistant Examiner* — Monica Mata
(74) *Attorney, Agent, or Firm* — TraskBritt

(57) ABSTRACT

A hybrid structure for a surface acoustic wave device comprises a useful layer of piezoelectric material having a first free surface and a second surface disposed on a support substrate that has a lower coefficient of thermal expansion than that of the useful layer, wherein the useful layer comprises an area of nanocavities.

20 Claims, 5 Drawing Sheets

(51) Int. Cl.
 *H03H 3/10* (2006.01)
 *H03H 9/02* (2006.01)
 *H10N 30/072* (2023.01)
 *H10N 30/00* (2023.01)

(52) U.S. Cl.
 CPC .... *H03H 9/02574* (2013.01); *H10N 30/1051* (2023.02); *H10N 30/10516* (2023.02)

(58) Field of Classification Search
 CPC ............. H03H 9/02574; H10N 30/072; H10N 30/10516; H10N 30/1051
 USPC .............................................. 310/313, 313 R
 See application file for complete search history.

(56) References Cited

U.S. PATENT DOCUMENTS

| | | | |
|---|---|---|---|
| 2010/0293770 A1* | 11/2010 | Fuyutsume | H03H 3/02 29/25.35 |
| 2012/0161585 A1* | 6/2012 | Nakahara | H03H 3/02 29/25.35 |
| 2016/0065162 A1 | 3/2016 | Zinke | |

FOREIGN PATENT DOCUMENTS

| | | |
|---|---|---|
| EP | 2658123 A1 | 10/2013 |
| JP | 2008-219720 A | 9/2008 |
| JP | 2012-005106 A | 1/2012 |
| JP | 2012-109399 A | 6/2012 |

OTHER PUBLICATIONS

Japanese Official Notice of Rejection for Japanese Application No. 2018-563171 dated Mar. 9, 2021, 4 pages.
International Written Opinion for International Application No. PCT/FR2017/051339 dated Sep. 28, 2017, 5 pages.
International Search Report for International Application No. PCT/FR2017/051339 dated Sep. 28, 2017, 2 pages.
Hashimoto et al., Recent Development of Temperature Compensated SAW Device, 2011 IEEE International Ultrasonics Symposium Proceedings, pp. 79-86.
Abbott et al., Characterization of Bonded Wafer for RE Filters with Reduced TCF, Proc. 2005 IEEE International Ultrasonics Symposium, (Sep. 19-21, 2005), pp. 926-929.
Chinese First Notification of Office Action for Application No. 201780034366.2 dated Sep. 2, 2022, 7 pages.

* cited by examiner

HYBRID STRUCTURE FOR A SURFACE ACOUSTIC WAVE DEVICE

CROSS-REFERENCE TO RELATED APPLICATIONS

This application is a national phase entry under 35 U.S.C. § 371 of International Patent Application PCT/FR2017/051339, filed May 30, 2017, designating the United States of America and published as International Patent Publication WO 2017/207911 A1 on Dec. 7, 2017, which claims the benefit under Article 8 of the Patent Cooperation Treaty to French Patent Application Serial No. 1655030, filed Jun. 2, 2016.

TECHNICAL FIELD

The present disclosure relates to the field of surface acoustic wave devices and, in particular, to a hybrid structure suitable for the production of surface acoustic wave devices.

BACKGROUND

Acoustic resonator structures such as surface acoustic wave (SAW) devices use one or more interdigital transducers set in a piezoelectric substrate to convert electric signals into acoustic waves and vice versa. Such SAW devices or resonators are often used in filtering applications. Radio frequency (RF) SAW technology has high performances such as high insulation and low insertion losses. For this reason, it is widely used for RF duplexers in wireless communication applications. Nevertheless, to be more competitive with respect to bulk acoustic wave (BAW) duplexers, the performance of RF SAW devices needs to improve and, in particular, it is required that their frequency response be stable with respect to the temperature.

SAW device operating frequencies are temperature-dependent, in other words, the temperature coefficient frequency (TCF) depends partially on variations in the transducer interdigital electrode spacing, which are, in turn, generally due to relatively high coefficients of thermal expansion (CTE) in the piezoelectric substrates used. In addition, the TCF depends on the coefficient of thermal velocity, since the expansion or contraction of the piezoelectric substrate is accompanied by an acceleration or deceleration of the surface acoustic wave. A possible target in minimizing the thermal coefficient frequency (TCF) is to minimize the expansion/contraction of the piezoelectric substrate, especially in the surface area in which the acoustic waves are going to be propagated.

The article by K. Hashimoto, M. Kadota et al., "Recent Development of Temperature Compensated SAW Devices," IEEE Ultrason. Symp. 2011, pages 79 to 86, 2011, gives an overview of current approaches to overcoming temperature dependence in SAW device frequency responses.

One approach comprises using a hybrid substrate, for example, by spreading a piezoelectric layer over a silicon substrate. The low CTE of silicon helps limit the temperature-based expansion/contraction of the piezoelectric layer. In the case of a piezoelectric layer of lithium tantalate (LiTaO3), the previously cited article indicates that a ratio of 10 between the thickness of LiTaO3 and the thickness of the silicon substrate allows for an adequate improvement of the thermal coefficient frequency (TCF). One of the drawbacks of this approach is due to the presence of spurious acoustic waves (called "spurious acoustic modes" in the article "Characterization of bonded wafer for RF filters with reduced TCF," B. P. Abbott et al., Proc. 2005 IEEE International Ultrasonics Symposium, Sep. 19-21, 2005, pages 926-929) that have a negative impact on the frequency characteristics of the resonator produced on the hybrid substrate. These spurious resonances are, in particular, linked with spurious reflections of the main acoustic wave (propagating mainly in a surface area of the layer of LiTaO3) on the underlying interfaces and, thus, in particular, the interface between the LiTaO3 and the silicon. One solution for reducing these spurious resonances is to increase the thickness of the layer of LiTaO3; this involves also increasing the thickness of the Si substrate to conserve the improvements of the TCF. In this case, the overall thickness of the hybrid substrate is no longer compatible with the need to reduce the thickness of the final components, in particular, to target the cellular telephone market. Another solution, proposed by K. Hashimoto et al., consists of roughening the lower surface of the LiTaO3 layer (at the bonding interface with the substrate) so as to reduce the reflections of the acoustic wave on the same. This roughening is one difficulty that needs to be managed when a direct bonding method, requiring very smooth assembly surfaces, is used for producing the hybrid substrate.

BRIEF SUMMARY

The present disclosure provides an alternative solution to the solutions of the prior art and, in particular, provides a hybrid structure that reduces and/or eliminates the spurious acoustic waves.

The present disclosure relates to a hybrid structure for a surface acoustic wave device that comprises a useful piezoelectric layer having a first free face and a second face disposed on a support substrate that has a lower coefficient of thermal expansion than that of the useful layer, wherein the useful layer comprises an area of nanocavities.

The area of nanocavities is suitable for diffusing an acoustic wave propagating in the thickness of the useful layer until reaching the area of nanocavities; it reduces or even eliminates the spurious reflections of the acoustic wave, which generally occur at the one or more interfaces of the hybrid structure and have a negative impact on the frequency characteristics of the SAW device.

Moreover, the area of nanocavities is formed in the thickness of the useful layer and does not affect the roughness of the second face, and this facilitates and improves the reliability of the assembly of the useful layer on the support substrate.

According to advantageous characteristics of the disclosure, taken either separately or in combination:
- the area of nanocavities has a functional thickness of 50 nm to 3 microns;
- the area of nanocavities is closer to the second face than to the first face of the useful layer;
- the area of nanocavities is located at a distance of more than 50 nm from the second face of the useful layer;
- the nanocavities have, at least in part, a maximum dimension of 1 nm to 500 nm;
- the nanocavities take up 10% to 20% of the volume in the area of nanocavities;
- the nanocavities are substantially spherical or polyhedral;
- all or part of the nanocavities contain a gas;
- the area of nanocavities extends in a plane parallel to the second face of the useful layer;
- the area of nanocavities is continuous in a plane parallel to the second face of the useful layer;

the area of nanocavities is discontinuous in a plane parallel to the second face of the useful layer;

the support substrate comprises a material selected from the group consisting of silicon, glass, silica, sapphire, alumina, aluminum nitride and silicon carbide;

the useful layer comprises a piezoelectric material selected from the group consisting of lithium tantalate (LiTaO3), lithium niobate (LiNbO3), quartz and zinc oxide (ZnO); and the hybrid structure comprises an intermediate layer located between the second face of the useful layer and the support substrate.

The present disclosure also relates to a surface acoustic wave device comprising a hybrid structure as above. The frequency of the acoustic waves is advantageously comprised between 700 MHz and 3 GHz.

The present disclosure finally relates to a method for manufacturing a hybrid structure for a surface acoustic wave device comprising:

a) a step of providing a useful piezoelectric layer having a first face and a second face;

b) a step of providing a support substrate that has a lower coefficient of thermal expansion than that of the useful layer; and c) a step of assembling the second face of the useful layer on the support substrate.

The method comprises a step of introduction of gaseous species into the useful layer to form an area of nanocavities.

According to advantageous characteristics of the disclosure, taken either separately or in combination:

the useful layer provided in step a) is comprised in a piezoelectric donor substrate;

the manufacturing method comprises, after the assembly step, a step d) of thinning the donor substrate to a thickness that is useful for forming the useful layer;

the gaseous species introduction step comprises at least one implantation of ions selected from the group consisting of hydrogen, helium, argon and other noble gases;

the manufacturing method comprises a thermal treatment step after the gaseous species introduction step;

the introduction of gaseous species into the useful layer is carried out on the second face thereof, before the assembly step;

the introduction of gaseous species into the useful layer is carried out on the first face thereof, after the assembly step; and the introduction of gaseous species into the useful layer is carried out locally by applying a mask.

BRIEF DESCRIPTION OF THE DRAWINGS

Further characteristics and advantages of the disclosure will be clear from the detailed description, made in reference to the accompanying figures, among which.

DETAILED DESCRIPTION

Figure 1:
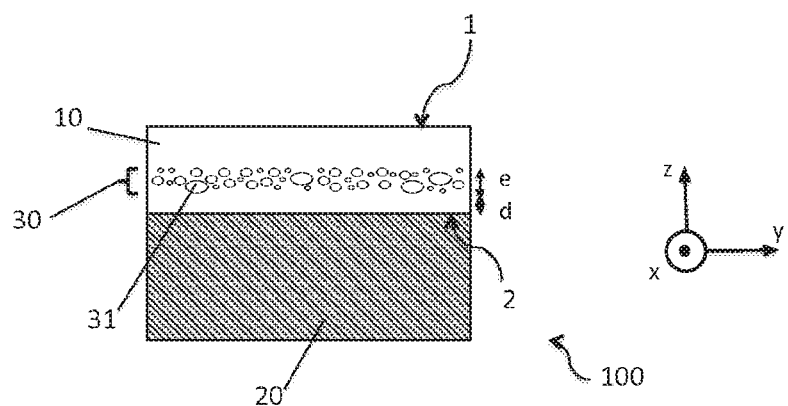
FIG. 1 shows a hybrid structure according to the disclosure.

In the descriptive part, the same references in the figures can be used for elements of the same type.

The figures are schematic representations that, for the sake of clarity, are not to scale. In particular, the thicknesses of the layers according to the Z axis are not to scale relative to the lateral dimensions according to the X and Y axes. Likewise, the size of the nanocavities is not to scale relative to the layer thicknesses or other lateral dimensions of elements of the disclosure.

The disclosure relates to a hybrid structure 100 for a surface acoustic wave device comprising a useful piezoelectric layer 10 having a first free face 1 and a second face 2 disposed on a support substrate 20. The useful layer 10 typically has a useful thickness of 1 micron to 50 microns, according to the type of SAW device to be produced on the hybrid structure 100. The useful layer 10 advantageously comprises a piezoelectric material selected from the group consisting of lithium tantalate (LiTaO3), lithium niobate (LiNbO3), quartz and zinc oxide (ZnO).

The support substrate 20 of the hybrid structure 100 has a lower coefficient of thermal expansion than that of the useful layer 10, at least along a crystallographic axis in the case of anisotropic materials. It may comprise a material selected from the group consisting of silicon, glass, silica, sapphire, alumina, aluminum nitride and silicon carbide.

Evidently, this list of materials is not exhaustive, and other substrates or useful piezoelectric layers may be chosen according to the type of applications and the properties required.

The hybrid structure 100 also comprises an area 30 of nanocavities 31, in the useful layer 10, as shown in FIG. 1.

The nanocavities 31 preferably have a substantially spherical, polyhedral or ellipsoidal shape. This shape is advantageous in that it promotes multidirectional reflection and, thus, the diffusion of acoustic waves likely to propagate in the thickness of the useful layer 10, preventing them from reflecting on a planar surface such as the interface between the useful layer 10 and the support substrate 20. The nanocavities 31 can be empty or contain a gas or even a mixture of gases.

The nanocavities 31 typically have a maximum size of 1 nm to 500 nm; maximum size being understood to be, for example, the diameter of the nanocavity if it is spherical or the largest diameter if it is slightly ellipsoidal. The density of nanocavities 31 in the area 30 is such that they preferably take up 10% to 20% of the volume of the area 30. The size and the density of the nanocavities 31 can affect the acoustic wave diffusion efficiency. Thus, the size and density parameters of the nanocavities 31 can be adjusted according to the frequency of the acoustic wave(s) propagating in the device to be produced on the hybrid structure 100.

The area 30 of nanocavities 31 advantageously has a so-called functional thickness e of 50 nm to 3 microns, along the Z axis in FIG. 1. The functional thickness e is advantageously chosen to be equal to or substantially smaller than the wavelength λ of the acoustic signal used for the SAW device, for example, comprised between λ and λ/8. On the other hand, the maximum mean diameter of the nanocavities will preferably be chosen to be smaller than or equal to the wavelength λ of the acoustic wave, typically comprised between λ/10 and λ. This configuration promotes the interaction between the acoustic wave and the area 30 of nanocavities 31. In particular, the acoustic wave portion that usually reflects off the interfaces of the hybrid structure will be advantageously diffused by the area 30, resulting in strongly limiting or even eliminating the reflected component of the acoustic wave that is the source of the spurious effects.

The area 30 of nanocavities 31 is preferably near the second face 2 of the useful layer 10. In particular, it may be placed at a distance of the order of 50 nm from the second face 2. It may, as an alternative, be placed at a distance comprised between a few nm and around 30% of the useful thickness. For example, for a useful layer 10 with a useful thickness of 10 microns, the area 30 may be located at a distance of 50 nm to 3 microns from the second face 2.

The area 30 of nanocavities advantageously extends in a plane parallel to the second face 2 of the useful layer 10. It may be continuous in the useful layer 10, i.e., present throughout the hybrid structure 100. This configuration grants plenty of scope for positioning the SAW device on the hybrid structure 100.

Figure 2:
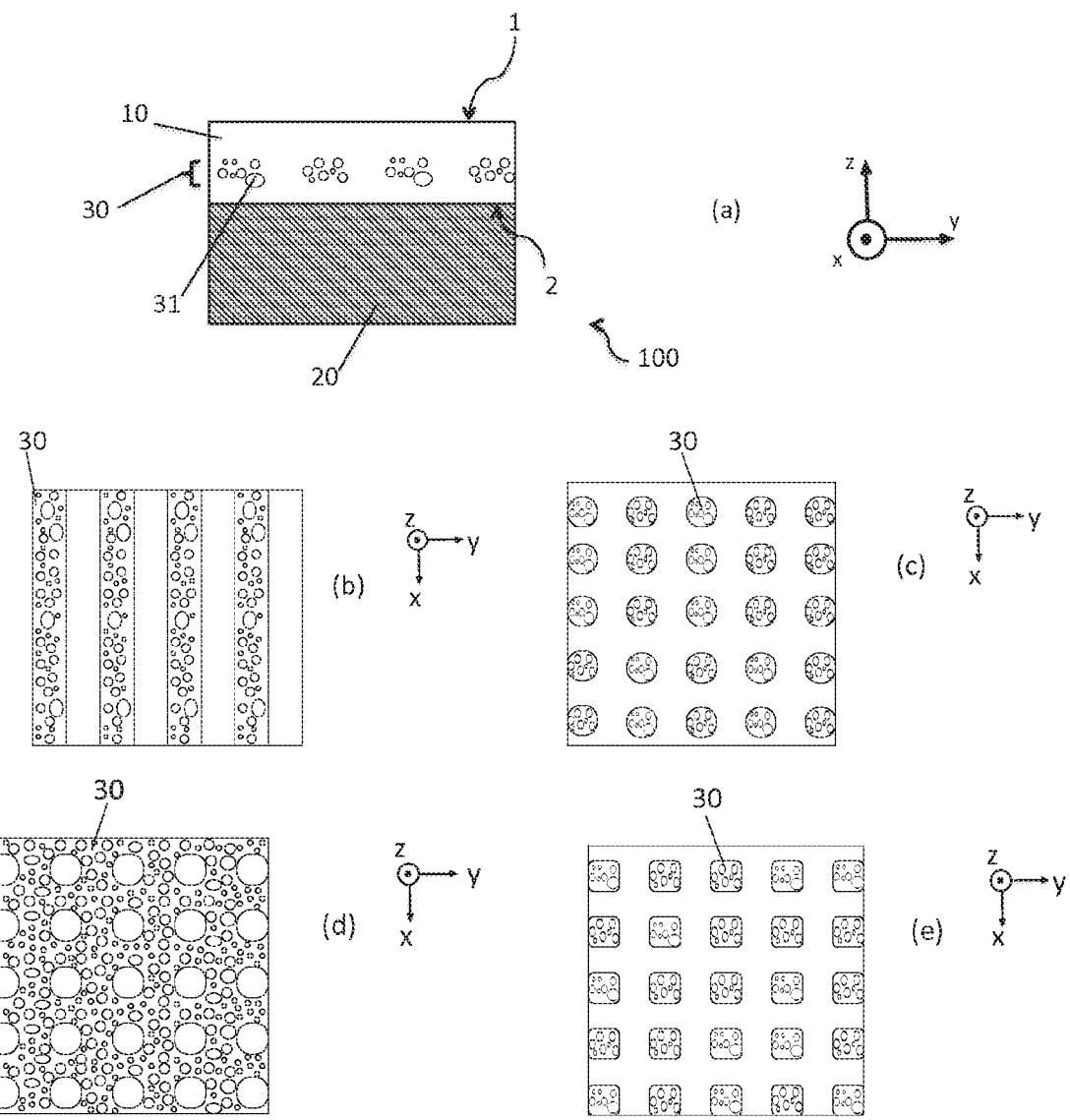
FIG. 2, Panel (a), shows a cross-sectional view, while Panels (b) through (e) show top views of hybrid structures according to the disclosure.

As an alternative, the area 30 of nanocavities 31 can be discontinuous and only have a local presence, in certain regions of the useful layer 10, as shown in FIG. 2, Panel (a). By way of non-limiting example, when viewed from above, the area 30 of nanocavities 31 can adopt the shape of strip patterns (FIG. 2, Panel (b)), circular patterns (FIG. 2, Panel (c)), regions complementing circular patterns (FIG. 2, Panel (d)) or even square patterns (FIG. 2, Panel (e)). A dimension, in the plane (x, y), of the regions comprising the area 30 of nanocavities, is preferably between 1 micron and 10 microns.

The discontinuity of the area 30 of nanocavities 31 can offer advantages in the case of acoustic waves with long wavelengths (of the order of 5 microns and more); indeed, the presence of larger patterns with larger periods than the nanocavities 31 can promote the interaction of the acoustic wave with the discontinuous area 30 and thus improve the diffusion of the wave.

According to another embodiment, the local area 30 of nanocavities can be present only in the regions on which the electrodes of the SAW device will be produced, the acoustic waves propagating between the electrodes.

Figure 3:
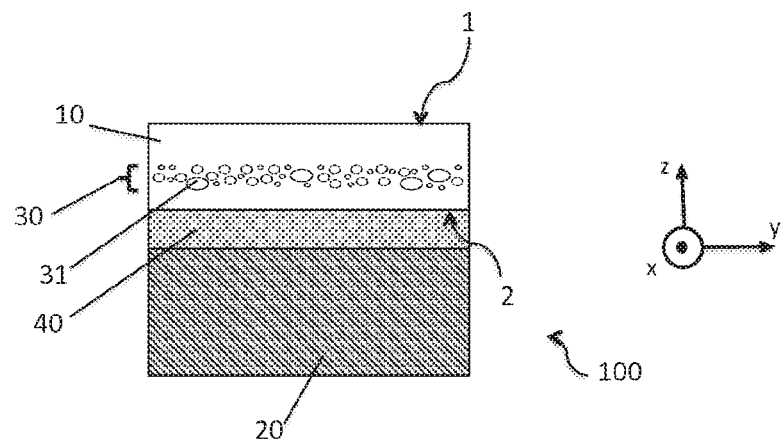
FIG. 3 shows a hybrid structure according to the disclosure.

The hybrid structure 100 according to the disclosure can likewise include an intermediate layer 40, disposed between the second face 2 of the useful layer 10 and the support substrate 20 (FIG. 3). This intermediate layer 40 is, for example, made of a material selected from the group consisting of silicon oxide, silicon nitride, amorphous or polycrystalline silicon, etc. The intermediate layer 40 can have a function (electrical insulation, trapping of charge carriers, etc.) in the future SAW device, which will be produced on the hybrid structure 100. It can also be used to facilitate the assembly between the useful layer 10 and the support substrate 20, in particular, for reinforcing the bonding energy of the assembly interface.

Figure 4:
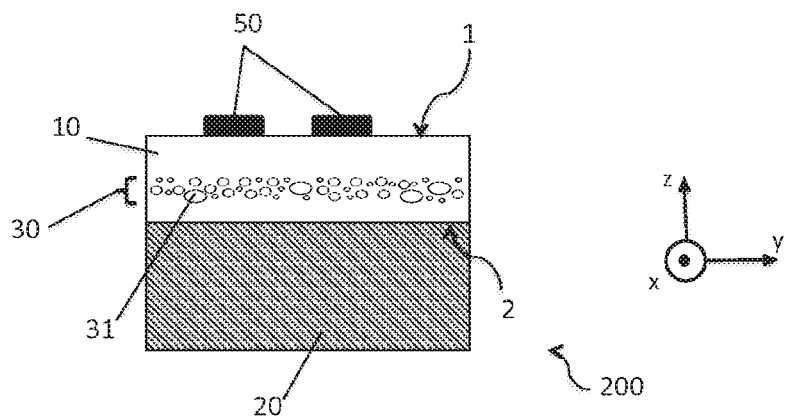
FIG. 4 shows a surface acoustic wave device according to the disclosure.

The hybrid structure 100 according to the disclosure is suitable for the production of a surface acoustic wave device 200, a simplified representation of which is provided in FIG. 4. Such a SAW device 200 comprises, in particular, metal electrodes 50 disposed on the first face 1 of the useful layer 10. One or more acoustic waves will be propagated between the electrodes 50 during the operation of the SAW device 200.

The area 30 of nanocavities 31 of the hybrid structure 100 is suitable for diffusing an acoustic wave propagating in the thickness of the useful layer 10 until reaching the area 30; it reduces or even eliminates the spurious reflections of the acoustic wave, which generally occur at the one or more interfaces of the hybrid structure 100 and have a negative impact on the frequency characteristics of the SAW device 200.

The hybrid structure 100 according to the disclosure is particularly suited to the production of SAW devices 200 using acoustic wave frequencies of 700 MHz to 3 GHz.

The present disclosure further relates to a method for manufacturing a hybrid structure 100 for a surface acoustic wave device 200 comprising a first step of providing a useful piezoelectric layer 10 having a first face 1 and a second face 2. The manufacturing method likewise includes a step of providing a support substrate 20 that has a lower coefficient of thermal expansion than that of the useful layer 10. It also comprises a step of assembling the second face 2 of the useful layer 10 on the support substrate 20. As is known, per se, different assembly techniques may be implemented, including bonding by molecular adhesion, bonding by adhesive, or any other type of bonding suited to the production of a hybrid structure. An intermediate layer 40 can be added prior to the assembly, either on the second face 2 of the useful layer 10, or on the face to be assembled of the support substrate 20, or on both. This intermediate layer 40 is, for example, made of silicon oxide, silicon nitride or even polycrystalline silicon and has a thickness between a few nanometers and a few microns. The intermediate layer 40 can be produced according to various techniques that are known in the prior art, such as thermal oxidation or nitridation treatments, chemical depositions (PECVD, LPCVD, etc.), and so on.

The manufacturing method according to the disclosure also comprises a step of introducing gaseous species into the useful layer 10 to form an area 30 of nanocavities 31. This step can be carried out before or after the step of assembling the useful layer 10 onto the support substrate 20. The gaseous species introduction step advantageously comprises at least one implantation of ions chosen among hydrogen, helium, argon and other noble gases. It is obviously possible to use other gases capable of forming nanocavities 31 in the useful layer 10.

As is generally known for a person skilled in the art, the implantation energy is chosen as a function of the sought depth for the area 30 of nanocavities 31. The dose of implanted ions is chosen from among the range that makes it possible to form nanocavities 31 in the material of the useful layer 10, with a size and density advantageously allowing the nanocavities 31 to take up 10% to 20% of the volume in the area 30. The dose of implanted ions is likewise chosen to be lower than the dose that is likely to generate deformations or other damage on either one of the faces 1, 2 of the useful layer 10.

According to the chosen functional thickness of the area 30 of nanocavities 31, one or more ion implantation steps may be carried out in the active layer 10, with different implantation energies, in order to widen the implantation profile and thus the functional thickness or with the purpose of forming a specific profile different from the substantially Gaussian profile generated by a single implantation.

According to one alternative, the gaseous species introduction step can be carried out locally in the useful layer 10. For this purpose, it is common to use a masking layer, deposited on the face of the useful layer 10 to be implanted, which protects regions in which it is sought to form the area 30 and which exposes regions in which the area 30 must be formed. It is thus possible to obtain a hybrid structure 100 such as those shown in FIG. 2, Panels (a) to (e).

The manufacturing method can advantageously comprise a thermal treatment step subsequent to the gaseous species introduction, making it possible to remove, at least partially, the gases from the useful layer 10 and, in particular, to form and/or stabilize the nanocavities 31 in the material. This thermal treatment may, for example, be carried out at a temperature of 200° C. to 900° C. during a period ranging from a few minutes to a few hours. The thermal treatment temperature will preferably be chosen to be lower than the Curie temperature of the piezoelectric material of the useful layer 10.

Specific embodiments of the manufacturing method will now be described in reference to FIGS. 5, 6 and 7.

Figure 5:
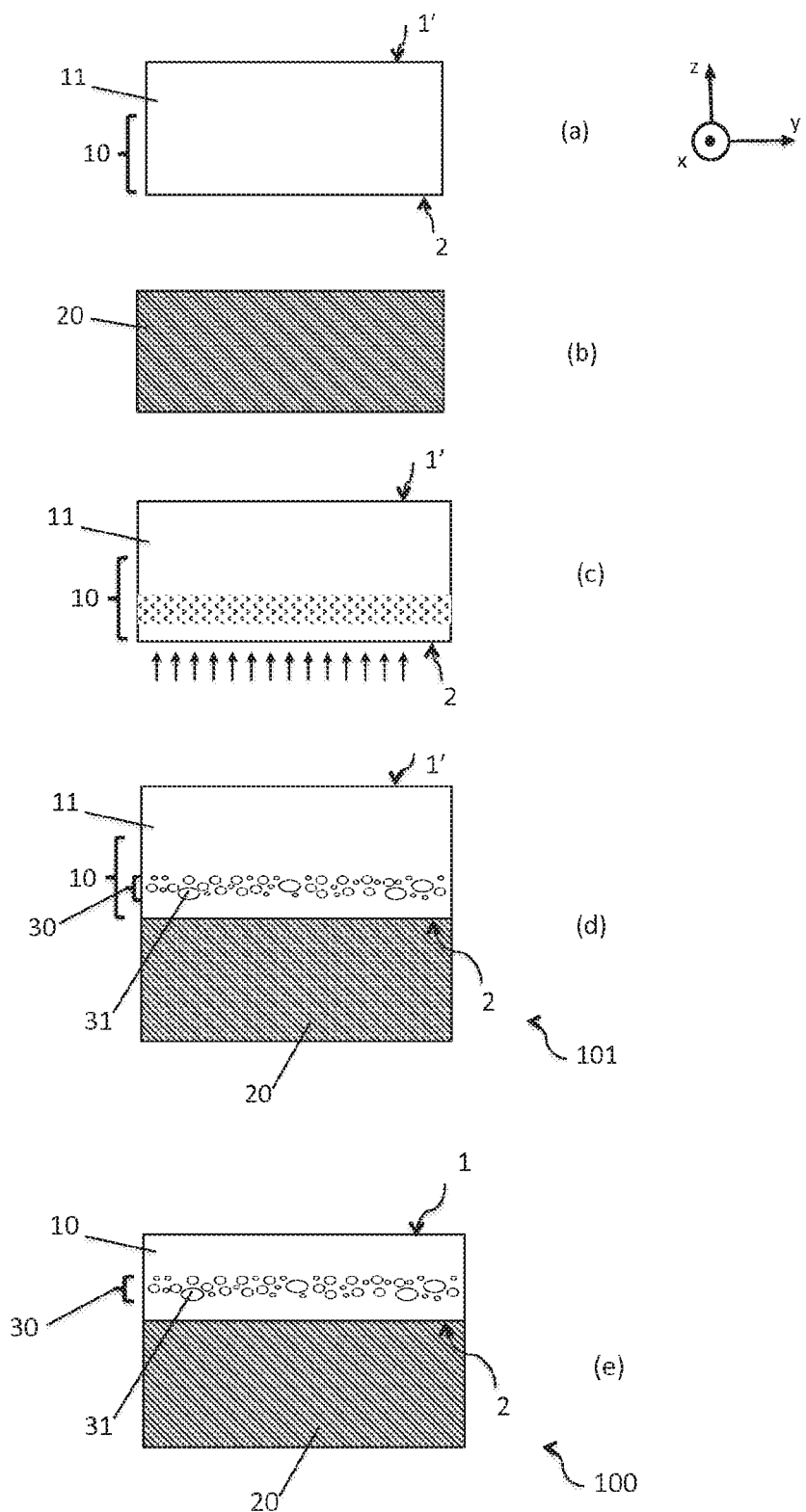
FIG. 5, Panels (a) through (e), show a method for manufacturing a hybrid structure according to a first embodiment of this disclosure.
Figure 6:
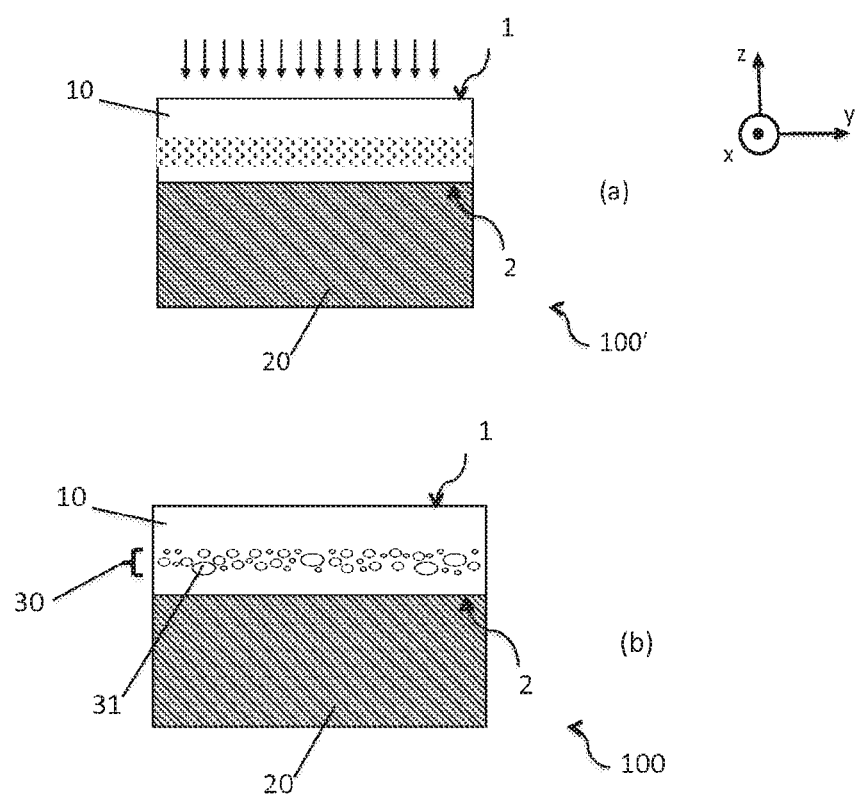
FIG. 6, Panels (a) and (b), show a method for manufacturing a hybrid structure according to a second embodiment of this disclosure.

According to a first embodiment of the disclosure, the first step of the method comprises providing a donor substrate 11 made of piezoelectric material (FIG. 5, Panel (a)), including the useful layer 10. The donor substrate 11 comprises a first face 1' and a second face 2. For example, it may consist of a piezoelectric material selected from the group consisting of lithium tantalate (LiTaO3), lithium niobate (LiNbO3), quartz and zinc oxide (ZnO).

The support substrate 20, which has a lower coefficient of thermal expansion than that of the donor substrate 11, is provided in a second step of the method (FIG. 5, Panel (b)). As indicated above, it may, for example, comprise a material selected from the group consisting of silicon, glass, silica, sapphire, alumina, aluminum nitride and silicon carbide.

Prior to the assembly step, the gaseous species introduction step is carried out on the second face of the donor substrate 11, as shown in FIG. 5, Panel (c). It thus generates a buried area, the thickness and the depth of which is dependent on the energy and the dose of ion implantation, as well as on the nature of the donor substrate 11. This buried area will form the area 30 of nanocavities 31. According to whether the implantation is carried out entirely on the second face 2 or locally, the area 30 will be either continuous or discontinuous, in a plane parallel to the second face 2.

The nanocavities 31 are either directly present after implantation, or formed and stabilized by a subsequent thermal treatment step. This thermal treatment step also has the advantage, in the present embodiment, of outwardly diffusing all or part of the gases of the donor substrate 11, prior to the assembly, which can, in particular, prevent degassing at the bonding interface, which is likely to degrade the mechanical strength and/or the quality thereof.

A step of assembling the second face 2 of the donor substrate 11 onto the support substrate 20 is then carried out (FIG. 5, Panel (d)). Bonding by molecular adhesion is an advantageous technique in that it does not require the addition of material in order to assemble the surfaces. It does, however, require a good surface condition (good flatness, low roughness, excellent cleanliness) to produce a high-quality assembly. The formation of the area 30 of nanocavities 31 according to the disclosure does not degrade the quality of the second face 2; the gaseous species introduction step is defined so that the buried area does not generate any deformation or damage on the second face 2 to be assembled.

To consolidate the bonding interface, the bonded hybrid structure 101 advantageously undergoes a thermal treatment. It should be noted that the materials of the donor substrate 11 and the support substrate 20 have very different coefficients of thermal expansion. The thermal treatment applied thus must remain at a temperature lower than the temperature at which the bonded hybrid structure 101 would be broken or damaged. The temperature range will typically be between a few tens of degrees and 500° C.

The manufacturing method according to this first embodiment of the disclosure also comprises a step of thinning the donor substrate 11, by the first face 1' thereof, so as to obtain a so-called useful thickness of the useful layer 10 and to form the first free face 1 (FIG. 5, Panel (e)). This useful thickness depends on the type of acoustic wave device that will be produced on the hybrid structure 100.

The thinning step can be based on known grinding, chemical mechanical polishing (CMP) and/or chemical etching (wet or dry) techniques. These methods are particularly suitable for forming thick useful layers, for example, from a few microns to several tens of microns, and up to a few hundred microns.

To form a thin useful layer 10, i.e., with a thickness of typically less than 2 microns, other layer transfer methods may be implemented, including the SMART CUT® method. This is based on an implantation of light ions of hydrogen and/or helium into the donor substrate 11 to form a weakened buried layer, at a depth relative to the second face 2 that is no smaller than the useful thickness. This implantation step can be carried out prior to the assembly step, before or after the formation of the area 30 of nanocavities 31.

A step of detachment, after the assembly on the support substrate 20, then makes it possible to separate a thin surface layer from the donor substrate 11 (the useful layer 10), at the weakened buried layer. Finishing steps, which may include thermal treatments and/or thinning by chemical etching or polishing, finally provide the required crystalline and surface quality to the useful layer 10. This method is particularly well suited to the production of thin useful layers.

According to a second embodiment of the disclosure, the step of introducing gaseous species into the useful layer 10 is performed after the assembly step. A hybrid structure 100' comprising the useful layer 10 disposed on the support substrate 20 is subjected to the gaseous species introduction step to form the area 30 of nanocavities 31 (FIG. 6, Panel (a)). The energy of the ions, in the case of an implantation, is advantageously chosen so that the area 30 is formed in the lower third of the useful layer 10, close to the second face 2.

A thermal treatment may be carried out in order to form and/or stabilize the nanocavities 31 of the area 30. This thermal treatment must take into account the difference in the coefficient of thermal expansion of the materials that make up the hybrid structure 100, shown in FIG. 6, Panel (b).

Figure 7:
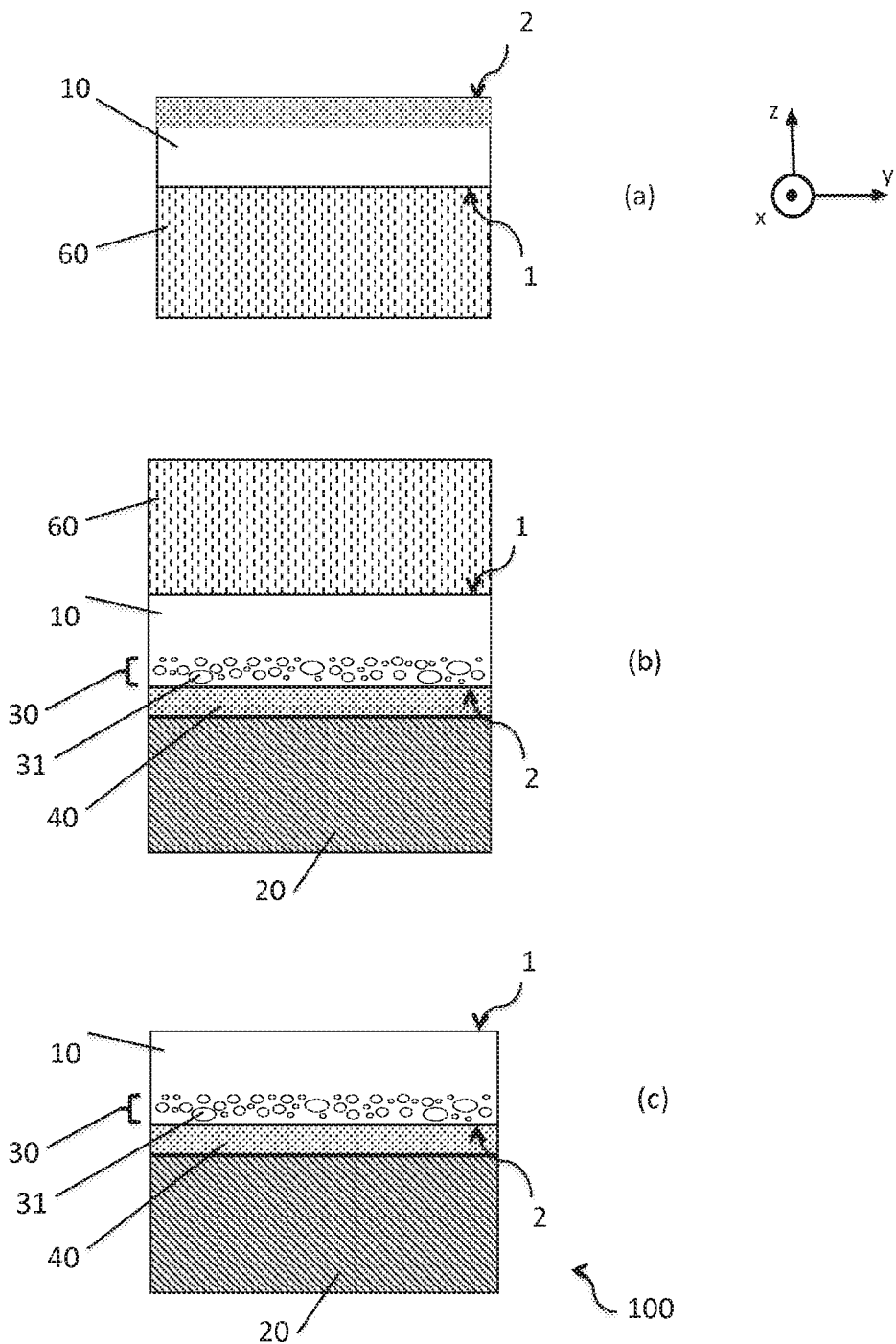
FIG. 7, Panels (a) through (c), show a method for manufacturing a hybrid structure according to a third embodiment of this disclosure.

According to a third embodiment of the disclosure, during the first supply step of the method, the first face 1 of the useful layer 10 is disposed on a temporary substrate 60 (FIG. 7, Panel (a)). It is advantageously transferred by the SMART CUT® method and thus includes a residue of the weakened buried layer on its second face 2.

An intermediate layer 40 is preferably deposited on the second face 2 of the useful layer 10 prior to the assembly thereof on the support substrate 20 (FIG. 7, Panel (b)).

The temporary substrate 60 is then removed, either by mechanical or chemical thinning, or by removal at the interface between the first face 1 of the useful layer 10 and the temporary substrate 60.

FIG. 7, Panel (c), shows the hybrid structure 100 obtained: the residue of the weakened buried layer, formed during the SMART CUT® method, makes it possible to generate the area 30 of nanocavities 31, in this embodiment, near the second face 2 of the useful layer 10.

This third embodiment is advantageous when the coefficients of thermal expansion (CTE) of the materials of the hybrid structure 100 make it difficult to directly apply the SMART CUT® method to transfer a thin useful layer 10 onto the support substrate 20. In this case, the useful layer 10 is first formed on a temporary substrate 60 (which can have the same CTE as the useful layer 10 or an intermediate CTE between that of the useful layer 10 and that of the support substrate 20), and then transferred onto the support substrate 20. The implantation of light ions required for the SMART CUT® method is then used to form the area 30 of nanocavities 31, avoiding any additional steps. In this third embodiment, however, there is little flexibility in the functional thickness of the area 30 and in the characteristics (dimensions, density, etc.) of the nanocavities 31, since the implantation parameters are dictated initially by the SMART CUT® method.

Example 1

A donor substrate 11 made of LiNbO3 is implanted, on its second face 2, with helium ions, having an energy of 180 keV and a dose of $3.5 \times 10^{16}$ He/cm$^2$. A protective layer, for example, made of SiO$_2$, is advantageously deposited on the second face 2, prior to the implantation, in order to limit the contamination of the donor substrate 11 during the implantation step.

Such an implantation typically forms an area 30 of nanocavities 31 with a functional thickness of the order of 700 nm, at a distance of the order of 350 nm from the second face 2.

The protective layer is removed by chemical etching.

A thermal treatment at 700° C. during 2 hours is carried out to stabilize the nanocavities 31 and remove all or part of the helium from the donor substrate 11.

The donor substrate 11 and a support substrate 20 made of silicon, for example, with thicknesses of 350 microns and 625 microns, respectively, then undergo cleaning sequences before being assembled by molecular adhesion, thus forming a bonded hybrid structure 101. The face 2 of the donor substrate 11 is of very high quality, compatible with direct bonding, and the implantation of gases to form the area 30 does not generate any surface deformations or damage.

Consecutive steps of grinding and polishing are applied to the first face 1' of the donor substrate 11, until obtaining the useful layer 10, with a useful thickness of 20 microns. The hybrid structure 100 according to the disclosure is thus formed.

This structure is suited to the production of a surface acoustic wave device 200, including, in particular, the formation of interdigital metal electrodes 50 on the first face 1 of the useful layer 10. The presence of the area 30 of nanocavities 31 according to the disclosure makes it possible to attenuate or even eliminate the spurious reflections of acoustic waves on the interface between the useful layer 10 and the support substrate 20; the acoustic waves propagating toward the interface are reflected in multiple directions and, thus, diffused by the plurality of nanocavities 31 forming the area 30.

Example 2

A masking layer is formed on the second face 2 of a donor substrate 11 made of LiTaO$_3$, resulting in masked regions and exposed regions. The exposed regions form, for example, circular blocks, as shown viewed from above in FIG. 2, Panel (c), separated from one another by masked regions. The exposed regions have a diameter of 5 microns, the separation between two adjacent exposed regions also being 5 microns.

The donor substrate 11 is then implanted on the second face 2 thereof, with helium ions, consecutively, with several energy levels: 140 keV, 160 keV, 180 keV, and with a dose of $2 \times 10^{16}$ He/cm$^2$ applied for each energy level.

The masking layer is removed by chemical etching.

A thermal treatment at 580° C. during 2 hours is carried out to stabilize the nanocavities 31 and remove all or part of the gases from the donor substrate 11.

The donor substrate 11 and a support substrate 20 made of silicon then undergo cleaning sequences, before being assembled by molecular adhesion, thus forming a bonded hybrid structure 101. The face 2 of the donor substrate 11 is of very high quality, compatible with direct bonding, and the implantation of gases to form the area 30 does not generate any surface deformations or damage.

Consecutive steps of grinding and polishing are applied to the first face 1' of the donor substrate 11, until obtaining the useful layer 10, with a useful thickness of 20 microns. The hybrid structure 100 according to the disclosure is thus formed.

This structure is suited to the production of a surface acoustic wave device 200, including, in particular, the formation of interdigital metal electrodes 50 on the first face 1 of the useful layer 10. The presence of the area 30 of nanocavities 31 according to the disclosure makes it possible to attenuate or even eliminate the spurious reflections of acoustic waves on the interface between the useful layer 10 and the support substrate 20; the acoustic waves propagating toward the interface are reflected in multiple directions and, thus, diffused by the plurality of nanocavities 31 forming the area 30.

The invention claimed is:

1. A hybrid structure for a surface acoustic wave device comprising a useful piezoelectric layer having a first free face and a second face disposed on a support substrate that has a lower coefficient of thermal expansion than a coefficient of thermal expansion of the useful piezoelectric layer, wherein the useful piezoelectric layer comprises an area of nanocavities.

2. The surface acoustic wave device comprising the hybrid structure as recited in claim 1.

3. The hybrid structure of claim 1, wherein the area of nanocavities has a functional thickness of 50 nm to 3 microns.

4. The hybrid structure of claim 1, wherein the area of nanocavities is located at a distance of more than 50 nm from the second face of the useful piezoelectric layer.

5. The hybrid structure of claim 1, wherein the nanocavities have a maximum size of 1 nm to 500 nm.

6. The hybrid structure of claim 1, wherein the area of nanocavities extends in a plane parallel to the second face of the useful piezoelectric layer.

7. The hybrid structure of claim 1, wherein the support substrate comprises a material selected from a group consisting of silicon, glass, silica, sapphire, alumina, aluminum nitride and silicon carbide.

8. The hybrid structure of claim 1, wherein the area of nanocavities has a functional thickness of 50 nm to 3 microns.

9. The hybrid structure of claim 8, wherein the area of nanocavities is located at a distance of more than 50 nm from the second face of the useful piezoelectric layer.

10. The hybrid structure of claim 9, wherein the nanocavities have a maximum size of 1 nm to 500 nm.

11. The hybrid structure of claim 10, wherein the area of nanocavities extends in a plane parallel to the second face of the useful piezoelectric layer.

12. The hybrid structure of claim 11, wherein the support substrate comprises a material selected from a group consisting of silicon, glass, silica, sapphire, alumina, aluminum nitride and silicon carbide.

13. The hybrid structure of claim 12, wherein the useful piezoelectric layer comprises a piezoelectric material selected from a group consisting of lithium tantalate (LiTaO$_3$), lithium niobate (LiNbO3), quartz and zinc oxide (ZnO).

14. The hybrid structure of claim 12, wherein the useful piezoelectric layer comprises a piezoelectric material selected from a group consisting of lithium tantalate (LiTaO$_3$), lithium niobate (LiNbO3), quartz and zinc oxide (ZnO).

15. The hybrid structure of claim 14, comprising an intermediate layer located between the second face of the useful piezoelectric layer and the support substrate.

16. The hybrid structure of claim 14, comprising an intermediate layer located between the second face of the useful piezoelectric layer and the support substrate.

17. A method for manufacturing a hybrid structure for a surface acoustic wave device comprising:
providing a useful piezoelectric layer having a first face and a second face;
providing a support substrate that has a lower coefficient of thermal expansion than a coefficient of thermal expansion of the useful piezoelectric layer;
assembling the second face of the useful piezoelectric layer on the support substrate; and
introducing gaseous species into the useful piezoelectric layer to form an area of nanocavities.

18. The method of claim 17, wherein the introducing of the gaseous species comprises at least one implantation of ions selected from a group consisting of hydrogen, helium, argon and other noble gases.

19. The method of claim 17, further comprising providing a thermal treatment after the introducing of the gaseous species.

20. The method of claim 17, wherein the introducing of the gaseous species into the useful piezoelectric layer is carried out locally by applying a mask.

\* \* \* \* \*